United States Patent
Okada et al.

(10) Patent No.: US 6,911,605 B2
(45) Date of Patent: Jun. 28, 2005

(54) FLEXIBLE PRINTED CIRCUIT (75) Inventors: Kenichi Okada, Tokyo (JP); Nobuo Tanabe, Tokyo (JP)

(73) Assignee: Fujikura Ltd. (JP)

( * ) Notice: Subject to any disclaimer, the term of this patent is extended or adjusted under 35 U.S.C. 154(b) by 0 days.

(21) Appl. No.: 10/116,291

(22) Filed: Apr. 3, 2002

(65) Prior Publication Data

US 2003/0089519 A1 May 15, 2003

(30) Foreign Application Priority Data

Nov. 13, 2001 (JP) ........................................ 2001-347787
Mar. 20, 2002 (JP) ........................................ 2002-079773

(51) Int. Cl.$^7$ .......................... H01K 1/03; H01L 23/06; H05K 1/00
(52) U.S. Cl. ......................... 174/256; 257/729; 361/750
(58) Field of Search ............................... 257/701, 729; 174/256, 257, 258, 254, 259, 268; 361/749–751

(56) References Cited

U.S. PATENT DOCUMENTS 4,448,484 A * 5/1984 Lombardi et al. ........... 385/128
4,781,969 A * 11/1988 Kobayashi et al. .......... 428/209
4,857,671 A * 8/1989 Nakano et al. .............. 174/259

(Continued)

FOREIGN PATENT DOCUMENTS

| JP | 06232553 A | * 8/1994 | ............ H05K/3/38 |
| JP | 2000-312059 | 11/2000 | |
| JP | 2000-323805 | 11/2000 | |
| JP | 2001015876 A | * 1/2001 | ............ H05K/1/03 |
| JP | 2001-168480 | 6/2001 | |

OTHER PUBLICATIONS

Nitta, K., et al., "Flexible Printed Circuits for Hard Disk Drive," Technical Report by Fujikura Ltd., Oct. 1990, pp. 81–87.

Suzuki, H., et al., "Effects Of Mechanical Properties Of Component Materials On The Life Of Flexible Printed Circuits," The Japan Society Of Mechanical Engineers, Thesis No. 900–59, 1990, pp. 102–104.

Hideto Suzuki, "A Basic Study on Estimation and Improvement of the Lifetime of Flexible Printed Circuits under Cyclic Bending," Department of Mechanical Engineering, Oyama National College of Technology, Tochigi, vol. 36, No. 1, 1991, pp. 49–57.

Merchant, H., et al., "Damage in Copper foil Based Flexible Circuits During Mechanical Fatigue," Technical Report by Gould Electronics Inc., pp. 29–53.

Merchant, H., et al., "Bendability of Thin Copper Foil," Technical Report by Gould Electronics Inc., pp. S02–4–1–S02–4–10.

Hibino, Y., et al., "Bending and Flexibility of Flexible Printed Circuit Boards," Technical Report No. 132, Sumitomo Electric Industries, Ltd., pp. 88–95.

Extracts from IPC Code No. 2223, "No. 2223 Sectional Design Standard for Flexible Printed Boards," IPC—Association Connecting Electronics Industries, Nov. 1998, pp. 10–13.

*Primary Examiner*—Alonzo Chambliss
(74) *Attorney, Agent, or Firm*—Bell, Boyd & Lloyd LLC (57) ABSTRACT

In order to provide low-cost, long fatigue life flexible printed circuit, low profile electrolytic foil is used as copper foil for a circuit 3 of the flexible printed circuit 10. Crack which does not penetrate the copper foil should preferably be formed on the low profile electrolytic foil. For methods to form cracks on the low profile electrolytic foil, methods such as pre-bending and etching can be employed. Due to the weakness of the low profile electrolytic foil, the base film 1, the cover layer 5, and the bonding agent 2, 4 which are disposed on the both sides of the low profile electrolytic foil should preferably be plastic film of which elasticity ratio is equal to $10^8$ Pa or more.

12 Claims, 8 Drawing Sheets

U.S. PATENT DOCUMENTS

| | | | | | |
|---|---|---|---|---|---|
| 4,913,955 | A | * | 4/1990 | Noda et al. | 442/234 |
| 5,288,950 | A | * | 2/1994 | Ushio et al. | 174/254 |
| 5,345,673 | A | * | 9/1994 | Saitoh | 29/846 |
| 5,437,914 | A | * | 8/1995 | Saida et al. | 428/209 |
| 5,516,989 | A | * | 5/1996 | Uedo et al. | 174/254 |
| 5,721,007 | A | * | 2/1998 | Lynch et al. | 427/98 |
| 5,837,380 | A | * | 11/1998 | Choi et al. | 428/480 |
| 6,010,769 | A | * | 1/2000 | Sasaoka et al. | 428/209 |
| 6,027,958 | A | * | 2/2000 | Vu et al. | 438/110 |
| 6,049,041 | A | * | 4/2000 | Yoshioka et al. | 174/117 FF |
| 6,051,877 | A | * | 4/2000 | Usami et al. | 257/679 |
| 6,159,410 | A | * | 12/2000 | Haga | 264/256 |
| 6,190,060 | B1 | * | 2/2001 | Tachihara et al. | 396/488 |
| 6,256,866 | B1 | * | 7/2001 | Dunn | 29/621 |
| 6,274,225 | B1 | * | 8/2001 | Miyake et al. | 428/209 |
| 6,310,298 | B1 | * | 10/2001 | Barrett et al. | 174/250 |
| 6,333,466 | B1 | * | 12/2001 | Miyaake et al. | 174/254 |
| 6,392,143 | B1 | * | 5/2002 | Koshio | 174/52.4 |
| 6,664,479 | B2 | * | 12/2003 | Tanabe et al. | 174/254 |

* cited by examiner

FLEXIBLE PRINTED CIRCUIT

BACKGROUND OF THE INVENTION

1. Field of the Invention

This invention relates to a flexible printed circuit to be used for wiring a hard disk drive (HDD) or the like. This invention particularly relates to a flexible printed circuit provided at lower-cost and having a longer fatigue life

2. Description of Related Art

Conventionally, flexible printed circuits (FPC) have recently been used extensively as wiring boards for printer heads, movable components like suspensions for hard disk drives (HDD), etc., because an FPC is thick, flexible, and has good fatigue life.

Figure 1:
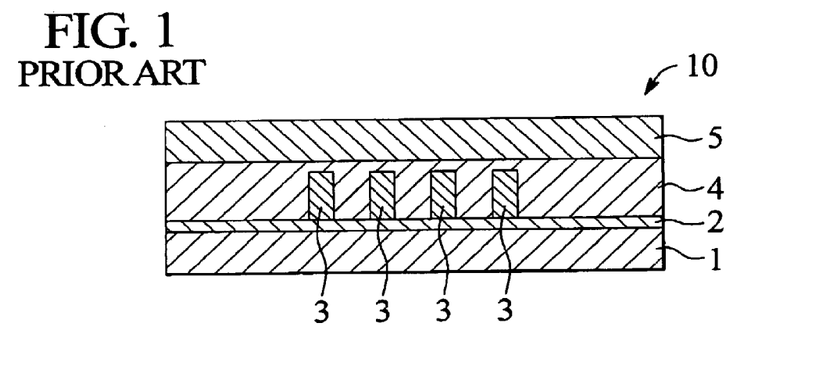
FIG. 1 is a cross section of a flexible printed circuit.

FIG. 1 is a cross section of this kind of FPC. Reference numeral 10 is a flexible printed circuit. This FPC is made in such a way that copper foil is put on a base film 1 by using a bonding agent 2; then, etching is performed on this copper foil, a circuit 3 is formed by leaving a part which is from a wiring and removing the rest of the part, and furthermore, a cover layer 5 is attached on this circuit 3 via bonding agent 4.

For such an FPC 10, long fatigue life is required so that disconnection due to the breaking of the circuit 3 does not occur due to the movement of the movable component, even if the FPC is bent more than tens of millions of times.

For this reason, a plastic film made of polyester resin such as polyimide resin and polyethyleneterephthalate (PET) which are excellent in flexibility are used for the base film 1 and the cover layer 5.

Also, the copper foil with very high purity such as rolled annealed foil (RA foil) which is superior in fatigue life, and low recrystallization temperature foil (HTE foil) is favorably used as the copper foil to be used for the circuit 3

The rolled annealed foil is made by repeatedly drawing a copper ingot with high purity in a roll strip mill and annealing it; thus, the rolled annealed foil is an intensively machined product, and has excellent fatigue life.

Also, the recrystallization temperature of the copper foil made of low recrystallization temperature foil is low; thus, the low recrystallization temperature foil has features that the recrystallization easily occurs even by a slight deformation, and relieves the deformation; thus, the low recrystallization temperature foil has high flexibility.

For FPC 10 in which particularly superior fatigue life is required, rolled annealed foil is used in most cases.

However, obtaining low cost FPC 10 is difficult because rolled annealed foil is expensive.

Also, in the case in which the bending is repeated and the bending diameter is small, even the rolled annealed foil will lose flexibility by fatigue, and finally the disconnection of the circuit 3 occurs because of cracking. This fatigue in the copper foil is mainly caused by lattice defects such as irreversible transmission which occurs when metallic organization receives plastic deformation. Such a defect is thought to form a crack with accumulating fatigue, and therefore the crack expands causing the disconnection.

This invention was made in view of the above condition, and an object of this invention is to provide a flexible print circuit which is made at lower cost and has superior fatigue life.

SUMMARY OF THE INVENTION

This invention provides a flexible printed circuit characterized in that the low profile electrolytic foil is used as a copper foil to be used in the circuit 3 in order to solve the above problems. The average diameter of the crystals in the low profile electrolytic foil should preferably be 0.1 to 5 $\mu$m.

For a low profile electrolytic foil, the crack should preferably be formed in advance. This crack can be formed by pre-bending or etching. Also, the length of the crack should preferably be in the range of 20 to 200 $\mu$m, the interval between the cracks should preferably be in the range of 2 to 100 $\mu$m.

Also, because the low profile electrolytic foil is not rigid enough, the base film 1 and the cover layer 5 which are disposed on both sides of the low profile electrolytic foil should preferably be a plastic film of which the modulus of elasticity is $10^8$ Pa or more.

In addition, by forming a layer of bonding agent of which the elasticity ratio is equal to $10^8$ Pa or more between the base film or the cover layer and the copper foil, the fatigue life of the flexible printed circuit becomes superior.

In the present invention, a low cost flexible printed circuit having superior fatigue life can be obtained. Even if a crack occurs in the circuit, the crack is imperceptible, and the crack does not expand easily, and thus the reliability of the flexible printed circuit is improved.

DETAILED DESCRIPTION OF THE INVENTION

A preferred embodiment of the present invention will be explained with reference to the drawings.

The basic structure of a flexible printed circuit according to this embodiment is almost the same as the flexible printed circuit shown in FIG. 1. A copper foil is attached on the base film 1 by using the bonding agent 2, and then a cover layer 5 is attached on the circuit 3 by using the bonding agent 4.

A low profile electrolytic foil (LP foil or VLP foil) is used as the above copper foil. This low profile electrolytic foil is a copper foil, and the average diameter of crystals in this low profile electrolytic foil is 0.1 to 5 $\mu$m, the surface finish is 2 $\mu$m or less on a matte surface, and the surface finish is 1 $\mu$m or less on a polished surface. The surface of the low profile electrolytic foil is flatter and smoother, and the crystal grains of the low profile electrolytic foil are finer then for other electrolytic foils such as standard electrolytic foil (STD foil) and middle profile electrolytic foil (MP foil); thus, this low profile electrolytic foil has been used for manufacturing fine circuits.

Figure 2:
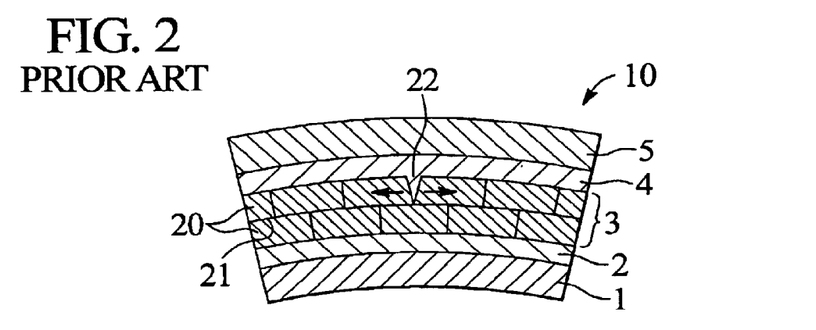
FIG. 2 is a drawing showing the state of a crack in a rolled annealed foil when it is bent.

As shown in FIG. 2, in the rolled annealed foil used in conventional FPC 10, there are fewer structural defects such as at grain boundaries 21 of a polycrystal 20. Therefore, rolled annealed foil has superior fatigue life, and thus the cracks 22 due to the fatigue life hardly occurs. However, if the number of repetitions (cycles of the bending is increased, the crack 22 may be formed due to the accumulation of fatigue, and if the bending load is concentrated on this crack 22 and increases, the circuit 3 may sometimes be broken.

Figure 3A:
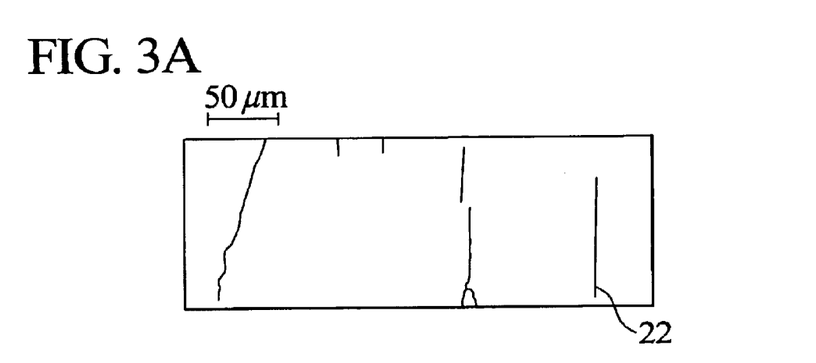
FIG. 3A is a plan view showing a part of the state of the surface of the rolled annealed foil after the bend.
Figure 3B:
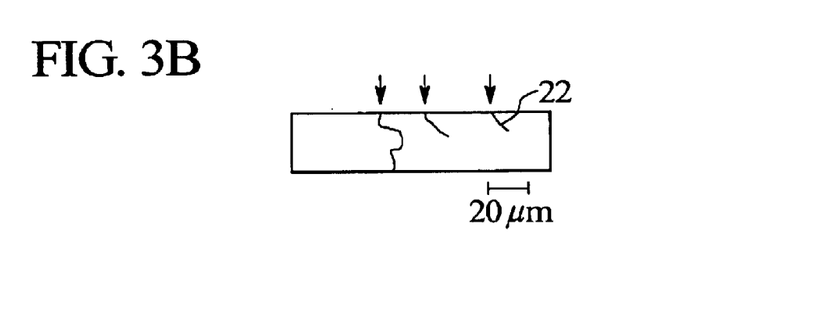
FIG. 3B is a cross section showing a part of the internal state of the rolled annealed foil after bending.

FIG. 3 shows an example of the state after the rolled annealed foil is bent one million times. FIG. 3A is a plan view showing a state of a part of the surface after bending. FIG. 3B is a cross section showing a state of an inside part after bending. As shown in FIG. 3, it may be understood that although the density of the number of occurrences of the crack 22 is low in rolled annealed foil, once a crack 22 forms, it expands easily and penetrates easily to the width direction and in the thickness direction of the circuit 3.

Figure 4:
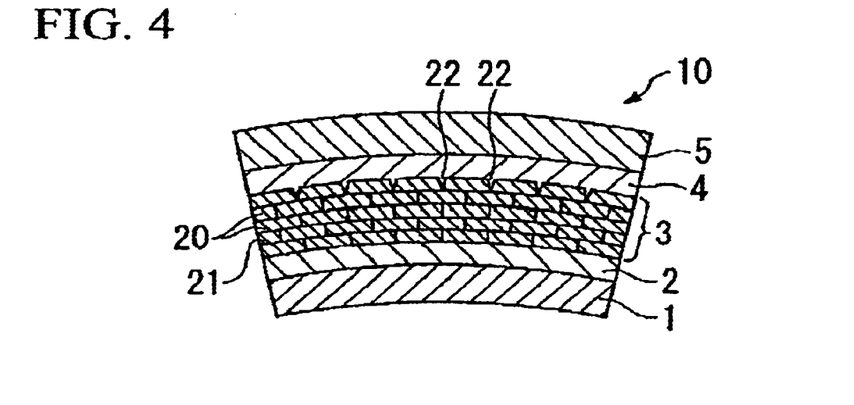
FIG. 4 is a drawing showing the state of the crack in the low profile electrolytic foil during bending.

In contrast, as shown in FIG. 4, although the polycrystals 20 of low profile electrolytic foil are small, many grain boundaries 21 exist in low profile electrolytic foil, and low profile electrolytic foil has characteristics in that the crack 22 easily occurs due to the bending, but if many cracks 22 are formed on the surface of the low profile electrolytic foil, the load due to the bending is dispersed to each crack 22, and thus it is believed that the circuit 3 will not often break as a result.

Figure 5A:
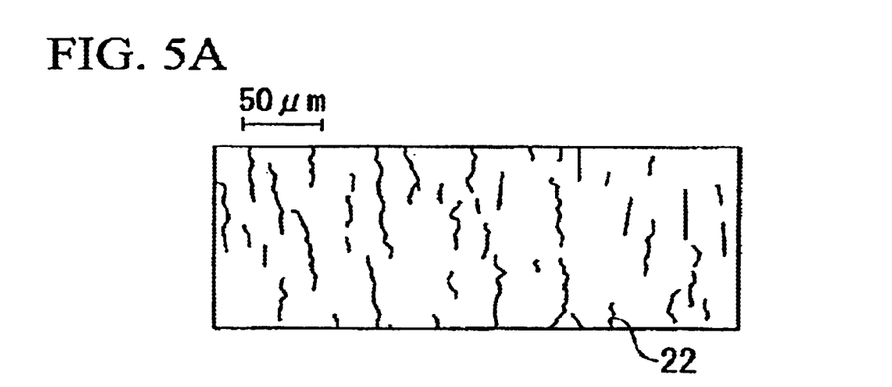
FIG. 5A is a plan view showing a part of the state of the surface of low profile electrolytic foil after bending.
Figure 5B:
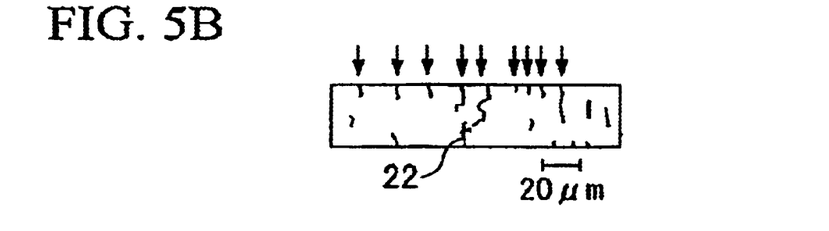
FIG. 5B is a cross section showing a part of the internal state of low profile electrolytic foil after bending.

FIGS. 5A and 5B show the state after the low profile electrolytic foil is bent one million times. FIG. 5A is a plan view showing the state of the surface after the bending. FIG. 5B is a cross section showing the internal state after the bending. As may be understood from this FIGS. 5A and 5B, although the density of the cracks 22 is high, the cracks do not expand enough to break the circuit 3.

Therefore, in an FPC 10 of this embodiment, fatigue life during low-distortion high-cycle is remarkabley improved as compared to the conventional FPC. Also if the FPC having a large expansion allowance before breakage is used, fatigue life is excellent during high-distortion low-cycle. In addition, low profile electrolytic foil is inexpensive as compared with rolled annealed foil, and a low-cost flexible printed circuit can be obtained.

Figure 6A:
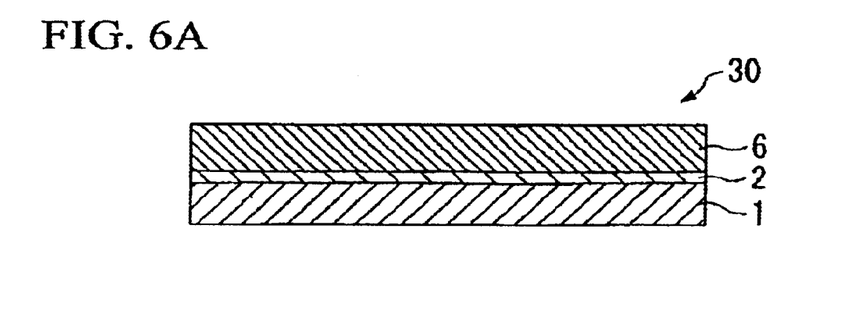
FIGS. 6A to 6C are cross sections explaining an example of a manufacturing method for a flexible printed circuit.
Figure 6B:
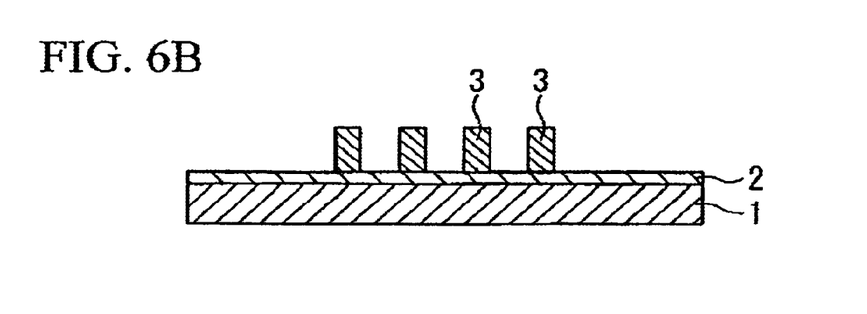
Figure 6C:
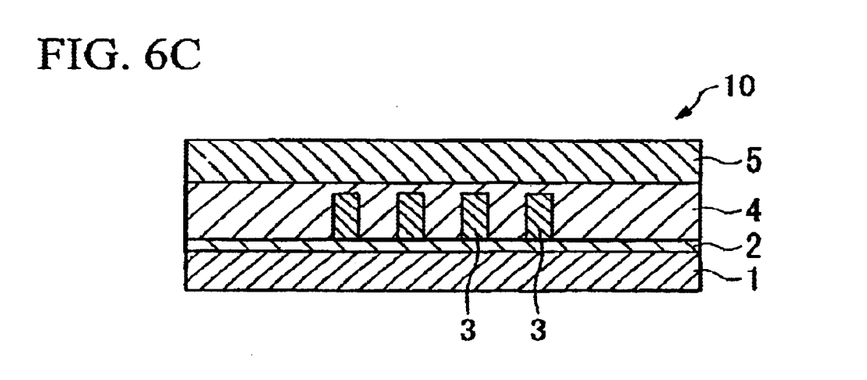

FPC 10 in this embodiment can be manufactured in the same way as conventional FPC. That is, as shown in FIG. 6, layered member 30 is formed by attaching low profile electrolytic foil 6 on the base film 1 by using bonding agent 2. Next, the resist (not shown) is applied on the low profile electrolytic foil 6 of the layered member 30 so as to fit to the circuit pattern; then, the circuit 3 is formed by etching using chemicals such as sulfuric acid, hydrofluoric acid, oxygenated water, iron oxide. Furthermore, FPC 10 can be obtained by attaching a cover layer 5 on the circuit 3 via bonding agent 4.

Figure 7A:
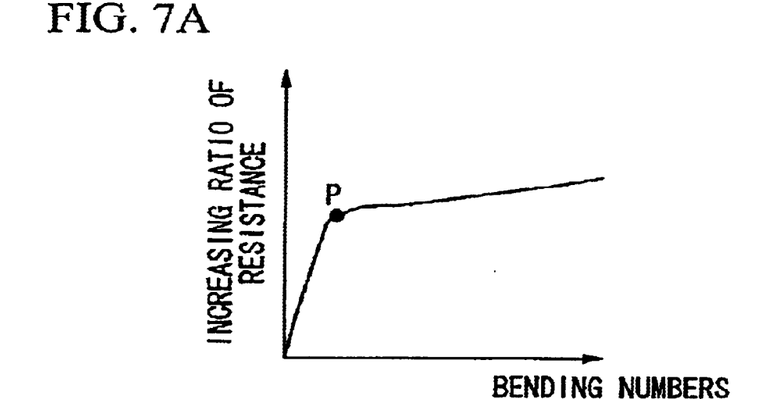
FIGS. 7A to 7B are for explaining the increase of the resistance value when the flexible printed circuit of the present embodiment is used.

When a flexible printed circuit of this embodiment is bent, as shown in FIG. 7A, the resistance increases nearly to 30% because the crack occurs on the low profile electrolytic foil 6 at the beginning stage of use. However, after the number of times it is bent exceeds the range between 100,000 and 300,000; thus, the flexible printed circuit has characteristics that the increasing ratio of the resistance due to the additional bending becomes quite small.

Figure 7B:
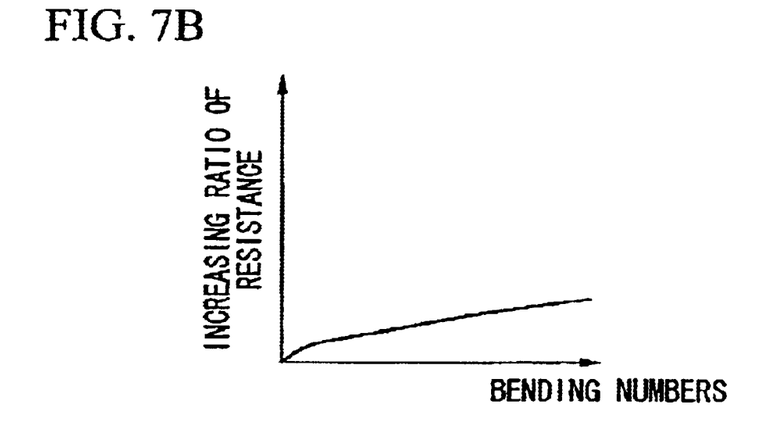

Therefore, the change of the increasing ratio of the resistance of the FPC 10 becomes small over a long time as shown in FIG. 7B if the crack 22 is made in such a way that the resistance increasing ratio of FPC is enhanced in advance to a point "P" in FIG. 7(A) by bending the FPC repeatedly. Thus, the low profile electrolytic foil 6 can be used stably; therefore the designing of circuit 3 becomes easy.

As a method to generate the crack 22 on the low profile electrolytic foil 6, the methods such as pre-bending and etching are possible. In the case of a method by pre-bending, FPC 10 should preferably be bent 100,000 to 300,000 times by a bending machine after the FPC 10 is manufactured, because the copper foil immediately tears if it is bent.

In the case of a method by etching, for example in a manufacturing method of FPC 10 as shown in FIG. 6, a circuit can be formed on the low profile electrolytic foil 6 by etching by including the notched section corresponding to the crack 22 in the circuit pattern.

That is, the crack 22 having predetermined dimension and shape can be formed by avoiding applying the resist on the section on which the crack 22 is formed when applying the resist for the circuit pattern on the low profile electrolytic foil 4, or by removing the resist after the resist is applied, and by etching by using chemicals such as sulfuric acid, hydrofluoric acid, oxygenated water, and iron oxide.

Figure 8:
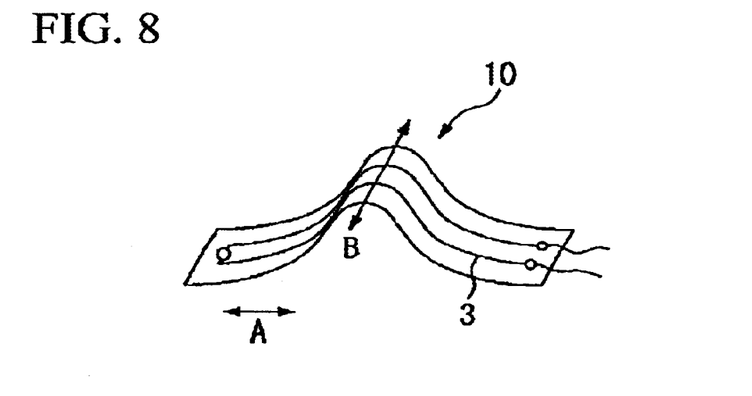
FIG. 8 is a perspective view showing how the flexible printed circuit of this embodiment is bent.
Figures 9A, 9B:
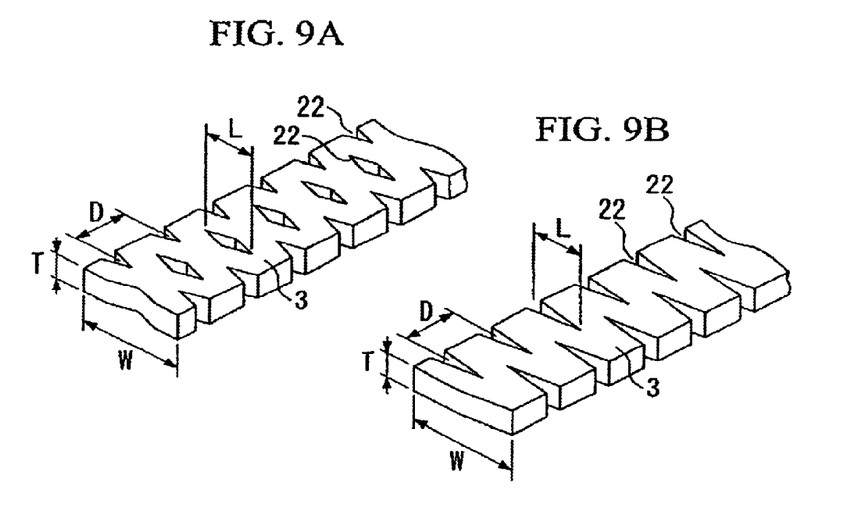
FIGS. 9A and 9B are perspective views explaining the state of the crack formed on the circuit in the flexible printed circuit of this embodiment.

In this case, the shape of the crack 22 should preferably correspond to the direction of the bend of the FPC 10. That is, for example, as shown in the FIG. 8, when FPC 10 is made to bend in the direction A. the direction of the crack 22 is in direction B which is perpendicular to the direction A. In general, because the circuit section of the circuit 3 is mostly disposed along the bending direction A, the cracks 22 should preferably be disposed alternately, for example as shown in FIGS. 9A and 9B.

In this case, the length L of a crack 22 should preferably be shorter than the width W of the circuit 3, or equal at maximum, more specifically, the length L of the crack 22 should preferably be in the range of 20 to 200 $\mu$m. More particularly, the average length of the crack 22 should preferably be 50 to 100 $\mu$m.

When the length L of the crack 29 is shorter than 20 $\mu$m, sufficient effect which disperses forces applied externally to bend the circuit cannot be obtained; thus, the fatigue life does not improve. If the length L of the crack 22 is longer than 200 $\mu$m, this is not preferable because the circuit 3 tends to tear at the crack 22.

Also, the distance D of the crack 22 should preferably be 2 to 100 $\mu$m, in particular, the distance D of the crack 22 should preferably be less than twice the thickness T of the circuit 3. If the distance D of this crack 22 is less than 2 $\mu$m, this is not preferable because the possibility that circuit 3 will disconnect due to the connection of the cracks 22 increases. Also, if the distance D of the crack 22 is longer than 100 μm, improving effect on fatigue life is small because the density of the number of the cracks 22 per unit area decreases.

In FPC 10 of this embodiment, because the resistance of the copper foil to bending is weak, the material for the base film 1 and the cover layer 5 disposed on both sides of the copper foil should preferably be plastic with an elasticity ratio of $10^8$ Pa or more so as to maintain the shape of the copper foil.

If this elasticity ratio is less than $10^8$ Pa, the deformation amount of the copper foil during bending increases; thus, the copper foil may possibly tear. Although the maximum elasticity ratio of the above plastic is not limited in particular, because, in general, as plastic and an FPC to be used, there are few plastics in which the elasticity ratio is over $10^{10}$ Pa, and the plastic should preferably be chosen among which the elasticity ratio is in a range of $10^8$ to $10^{10}$ Pa.

Also, for bonding agent 24 which bonds the base film 1 or the cover layer 5 with the circuit 3, a bonding agent such as epoxy bond is used in general, and it is preferable to use a bonding agent of which elasticity ratio after hardened is $10^8$ or more. By doing this way, it becomes possible to restrict the transformation of the copper foil during bending; thus, the fatigue life of the flexible printed circuit can be improved.

Figure 10:
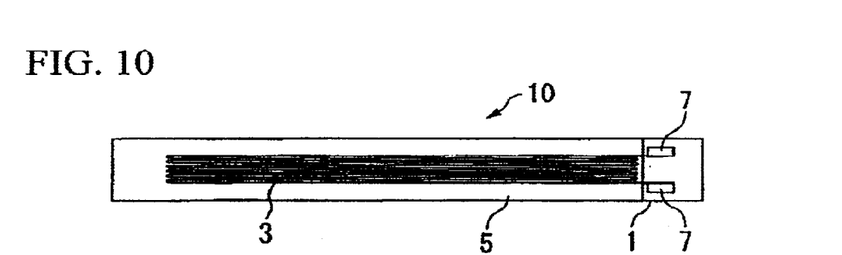
FIG. 10 is a plan view showing an example of the flexible printed circuit.
Figure 11:
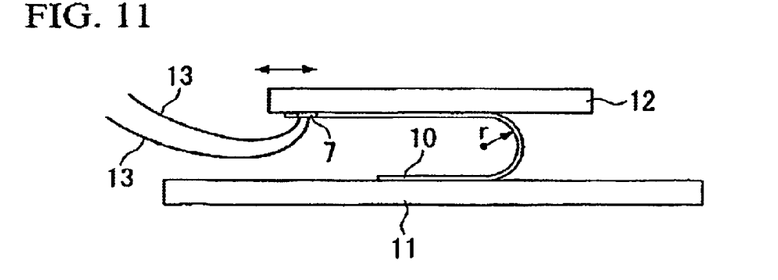
FIG. 11 is a view showing how the bending test is performed.

Next, an embodiment of the present invention is explained more specifically compared with the prior art. FIG. 10 is a plan view of the FPC 10 manufactured as a sample. FIG. 11 is a drawing for explaining the method of the bending test.

The length of FPC 10 shown in FIG. 10 as a sample is 100 μm, and its width is 10 μm. The base film 1 and the cover layer 5 are polyimide resin films each 25 μm thick. The bonding agents 2 and 4 are epoxy resins, and the thickness of a layer thereof is 10 μm. Additionally, the thickness of the copper foil which comprises the circuit 3 is 35 μm. On both ends of the circuit 3, terminals 7 are disposed.

Here, as an embodiment of the present invention, low profile electrolytic foil (LP foil) is used as the above copper foil, and rolled annealed foil (RA foil) and standard electrolytic foil (STD foil) are used as comparison samples.

In the bending test shown in FIG. 11, FPC 10 is attached to a fixing fixture 11 and movable fixture 12 both of which are disposed in parallel respectively with a predetermined bending radius "r" Furthermore, electric wire 13 is attached to the terminals 7 of the FPC 10; thus, the resistance value between above terminals 7 can be measured by a resistance measuring device (not shown).

The resistance value between the terminals 7 is measured by reciprocating the movable fixture 12 against the fixed fixture 11 in a parallel direction, and the increasing ratio of the resistance of the FPC 10 against the number of times of bending is measured. Here, increasing the ratio of the resistance is represented as "100×(R−R0)/R0 (%)" under conditions that R0 is an initial value of the resistance between the terminals 7 of the FPC 10, and R is the resistance value when the FPC 10 is made to bend a predetermined number of times.

In the bending test, the bending radius "r" is 2 mm, the motion distance (stroke) of the reciprocating motion of the movable fixture 12 is 20 mm, and the reciprocating speed is 25 times/second.

Figure 12:
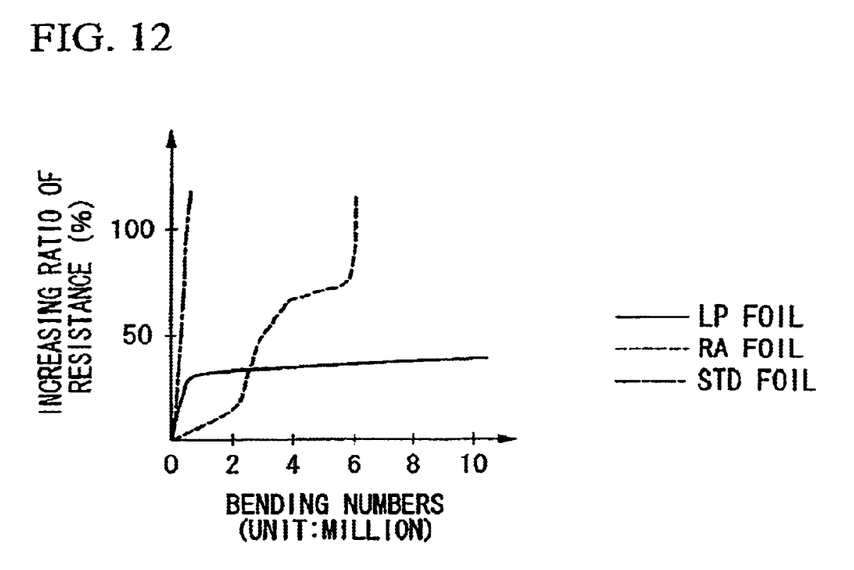
FIG. 12 is a graph showing an example of the relationship between the number of times the bending test is performed and the increasing ratio of the resistance value of FPC.

The results of the above bending test are shown in FIG. 12. As shown by the result, it can be understood that the increasing ratio of the resistance of FPC 10 of an embodiment in which LP foil is used is relatively larger in the initial stage of the bending as compared to the FPC on which the conventional RA foil of the comparison sample is used, the increasing ratio of the resistance is small when the bending number is over 300,000 times; thus, the longer life of the FPC can be realized.

According to this fact, it is understood that FPC 10 of the embodiment is excellent in fatigue life when the bending number is large, and the FPC has a long fatigue life.

Also, it is understood that because of the relatively long fatigue life as compared to STD foil as another electrolytic foil the profile of the FPC 10 of the embodiment in which LP foil is used is low, thus, fatigue life is improved remarkably because polycrystals of fine grain were used.

Next, in order to research a relationship between the average diameter of crystal of copper foil 6 and the fatigue life of FPC 10, FPC 10 was manufactured by using a copper foils 6 of which average diameter of crystal are different, and the fatigue life was measured. For copper foils, isotropic low-profile electrolytic foil and needle-shape low-profile electrolytic foil were used. The average diameter of crystal of the copper foil 6 was measured according to a measuring method of JIS-H-0501-8. Also, the fatigue life of the FPC 10 was measured when the resistance increasing ratio reached to 50% in the bending test shown in FIG. 11.

Figure 13:
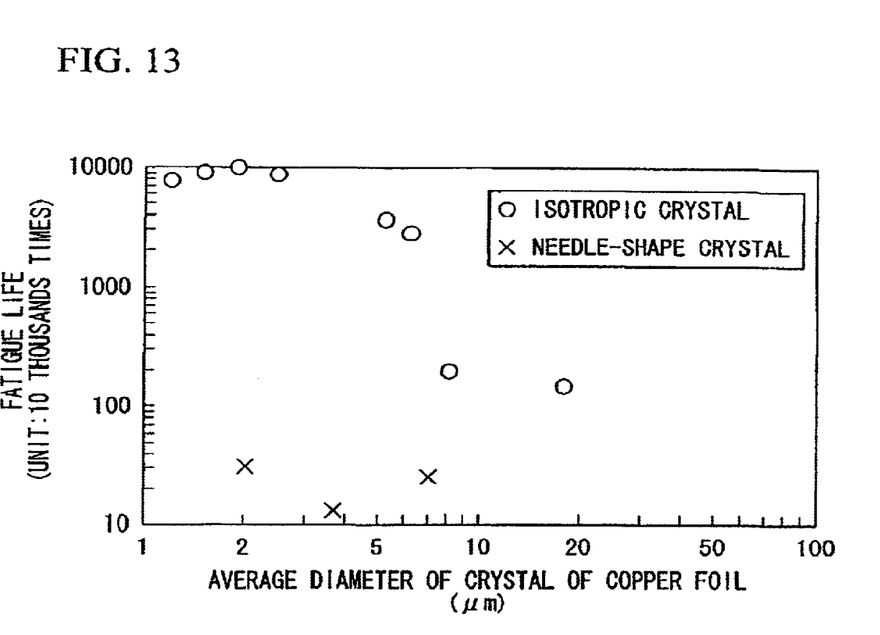
FIG. 13 is a graph showing an example of the relationship between the average diameter of crystal of copper foil and the fatigue life of FPC.

The result of above test is shown in FIG. 13. As understood from the result, when isotopic low-profile electrolytic foil is used as a copper foil 6 and the average diameter of crystal was 5 μm or less, the fatigue life reached to as high as several ten millions of bending; thus high fatigue life was exhibited. In contrast, when the average diameter of the crystal is 5 μm or larger, the fatigue life was remarkably low. When the copper foil 6 having needle-shaped crystal is used, the fatigue life was as high as several hundreds of bending; thus such fatigue life is not practical enough for a copper foil.

Next, in order to research the relationship of the elasticity ratio of the bonding layer made of bonding agent 2, 4 and fatigue life of FPC 10, FPC 110 was manufactured by using epoxy bonding agent as bonding agent 2, 4 of which elasticity ratio are different after hardening, and the fatigue life of each FPC 10 was measured. In the FPC 10, low profile electrollytic foil was used as copper foil 6. Also, the fatigue life of FPC 10 was measured when resistance increasing ratio reached to 50% in the bending test as shown in FIG. 11.

Figure 14:
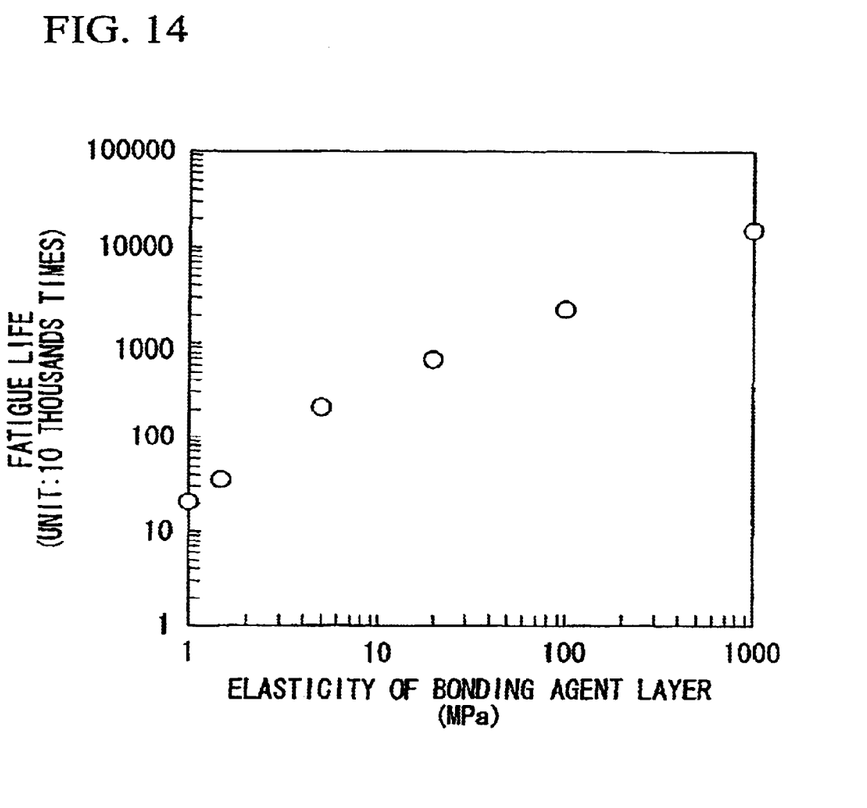
FIG. 14 is a graph showing an example of the relationship between the elasticity of the bonding agent and the fatigue life of FPC.

The result of the above test is shown in FIG. 14. As understood from the result, tendency that if elasticity of the bonding agent 2, 4 are larger, the fatigue life of FPC 10 becomes longer was shown. If the elasticity of the bonding agent 2, 4 is 100 MPa ($10^8$ Pa) or more, the fatigue life of FPC 10 was as high as one hundred million times; thus the fatigue life of FPC 10 was quite high.

Next, FPCs 10 were manufactured by using low profile electrolytic foils having qualities such as qualified, average, and defective as copper foil 6 having 200 μm of circuit width W, and the fatigue life of FPC 10 was measured according to above method. Also, the surface of the circuit 3 was observed after bending one million times, and the average interval of cracks 22 generated on the surface and the number of the crack per unit area, and the average length of cracks were measured. In this measurement, subtle cracks 22 of 10 μm length or less generated in edge section of the circuit 3 were not counted.

The result of the above observation and measurement are shown in TABLE 1.

TABLE 1

| | Fatigue Life | Interval of Cracks | Number of Cracks per unit area | Length of Cracks |
|---|---|---|---|---|
| A: Qualified | 50 million times or more | 24 to 33 μm | About 640 Cracks/mm² | 5 to 100 μm |
| B: Average | 5 to 50 million times | 60 to 160 μm | About 40 Cracks/mm² | 100 to 2000 μm |
| C: Defective | Less than 5 million times | 1000 μm or More | 1 Crack/mm² or Less | 200 μm or More |

As shown in TABLE 1, it is understood that the intervals cracks 22 formed on the surface of the circuit 3 is narrow, the density such as the number of cracks per unit area is high, and if the crack is short, the fatigue life tends to be longer.

What is claimed is:

1. A flexible printed circuit comprising:
   a base film;
   a circuit made of copper foil disposed on the base film; and
   a cover layer which covers the circuit;
   wherein the copper foil is low profile electrolytic foil, and the base film and the cover are plastic film of which the elasticity ratio is equal to $10^8$ Pa or more.

2. A flexible printed circuit according to claim 1, wherein an average diameter of crystal grain of the low profile electrolytic foil is 0.1 to 5 μm.

3. A flexible printed circuit according to claim 1, wherein a crack is formed on the low profile electrolytic foil.

4. A flexible printed circuit according to claim 3, wherein the crack has a length of 20 to 200 μm.

5. A flexible printed circuit according to claim 3, wherein a plurality of cracks are formed on the low profile electrolytic foil and an interval between cracks of the plurality of cracks is 2 to 100 μm.

6. A flexible printed circuit according to claim 3 wherein a plurality of cracks are formed on the low profile electrolytic foil and an interval between cracks of the plurality cracks of cracks is 24 to 33 μm.

7. A flexible printed circuit according to claim 3 wherein a plurality of cracks are formed on the low profile electrolytic foil and a length of the cracks is 5 to 100 μm.

8. A flexible printed circuit according to claim 3 wherein the low profile electrolytic foil is an isotopic low profile electrolytic foil and an average diameter of crystal in the isotopic low profile electrolytic foil is 5 μm or less.

9. A flexible printed circuit according to claim 1, wherein a crack is formed on the low profile electrolytic foil by pre-bending.

10. A flexible printed circuit according to claim 1, wherein a crack is formed on the low profile electrolytic foil by etching.

11. A flexible printed circuit according to claim 1, wherein a bonding agent of which the elasticity ratio is equal to $10^8$ Pa or more attaches the base film and the electrolytic foil and/or the cover layer and the circuit.

12. A flexible printed circuit comprising:
   a base film;
   a circuit made of copper foil disposed on the base film; and
   a cover layer which covers the circuit;
   wherein the copper foil is low profile eletrolytic foil,
   a plurality of cracks are formed on the low profile electrolytic foil, and
   cracks per unit area is about 640 crack/mm².

* * * * *